United States Patent [19]
Hyman

[11] Patent Number: 5,644,497
[45] Date of Patent: Jul. 1, 1997

[54] METHOD AND APPARATUS FOR COMPILING AND IMPLEMENTING STATE-MACHINE STATES AND OUTPUTS FOR A UNIVERSAL CELLULAR SEQUENTIAL LOGIC ARRAY

[76] Inventor: Edward Hyman, 1202 S. Irene Ave., Redondo Beach, Calif. 90277

[21] Appl. No.: 132,992

[22] Filed: Oct. 6, 1993

Related U.S. Application Data

[63] Continuation-in-part of Ser. No. 895,607, Jun. 8, 1992, Pat. No. 5,377,123, and Ser. No. 614,686, Nov. 15, 1990, Pat. No. 5,253,363, which is a continuation of Ser. No. 168,376, Mar. 15, 1988, abandoned.

[51] Int. Cl.$^6$ ............................................ H03K 17/693
[52] U.S. Cl. ........................... 364/489; 364/488; 326/41
[58] Field of Search ........................... 364/488, 489, 364/490, 716; 395/325, 500, 800; 340/825.83; 326/39, 41

[56] References Cited

U.S. PATENT DOCUMENTS

| | | | |
|---|---|---|---|
| 3,619,583 | 11/1971 | Arnold | 364/716 |
| 4,293,783 | 10/1981 | Patil | 326/40 |
| 4,574,394 | 3/1986 | Holsztynski et al. | 395/800 |
| 4,591,980 | 5/1986 | Huberman et al. | 395/800 |
| 4,694,411 | 9/1987 | Burrows | 364/578 |
| 4,709,327 | 11/1987 | Hillis et al. | 395/375 |
| 4,758,745 | 7/1988 | Elgamal et al. | 326/16 |
| 4,791,602 | 12/1988 | Resnick | 326/38 |
| 4,814,973 | 3/1989 | Hillis | 395/800 |
| 4,839,851 | 6/1989 | Maki | 395/800 |
| 4,845,633 | 7/1989 | Furtek | 326/38 |
| 4,855,903 | 8/1989 | Carleton et al. | 395/325 |
| 4,918,440 | 4/1990 | Furtek | 340/825.83 |
| 4,963,768 | 10/1990 | Agrawal et al. | 326/38 |
| 5,070,446 | 12/1991 | Salem | 395/500 |
| 5,157,618 | 10/1992 | Ravindra et al. | 364/490 |
| 5,185,706 | 2/1993 | Agrawal et al. | 364/489 |
| 5,231,588 | 7/1993 | Agrawal et al. | 364/489 |
| 5,253,181 | 10/1993 | Marui et al. | 364/489 |
| 5,317,698 | 5/1994 | Chan | 395/325 |
| 5,359,536 | 10/1994 | Agrawal et al. | 364/489 |
| 5,377,123 | 12/1994 | Hyman | 364/489 |

OTHER PUBLICATIONS

Williams, George H., "Array State Assignments in Sequential Circuit Synthesis" (Ph.D. Dissertation, Engineering, Electrical), Yale University Press, 1970.

Hyman, Edward, "Minimal Complexity Universal Cellular Arrays", Ph.D. A Dissertation, University of Southern California (Jan. 1974).

*Primary Examiner*—Vincent N. Trans
*Attorney, Agent, or Firm*—Merchant, Gould, Smith, Edell, Welter & Schmidt

[57] ABSTRACT

A universal sequential logic circuit is constructed from a rectilinear array of elementary logic "cells", with a relatively large number of logic states embodied in a relatively small array. The set of states from a state-machine description of the logic function desired to be performed is compiled into a software association of cellular array states with each state-machine state (4), and the set of transitions from the state-machine description is compiled into a software association of logical connections between cells. The cellular array performs the state-machine function under software control. The rectilinear array (1a) generally embodies one bit of cellular array state information for each row of logic cells, stored in diagonal cells of the array called "memory cells" (2). Non-diagonal cells of the array called "function cells" (3) are controlled by stored software, which controls the transfer of cellular array state information from each row to each other. Equivalence classes of state-machine states with respect to sequences of inputs are compiled, and one memory cell state is assigned to each such equivalence class. The function cells select which cellular array state follows the present one by selecting which logic state each memory cell in the array is to store next, each using a multiplexor under the control of stored memory bits.

17 Claims, 6 Drawing Sheets

FIG. 5A

| ∧ | 0 | 1 | z |
|---|---|---|---|
| a | b | b | 0 |
| b | c | a | 0 |
| c | b | a | 1 |

STEPS 422 AND INITIAL 424

| ∧ | 0 | 1 | 00 | 01 | 10 | 11 | 000 | 001 | 010 | 011 | 100 | 101 | 110 | 111 | 0010 |
|---|---|---|----|----|----|----|-----|-----|-----|-----|-----|-----|-----|-----|------|
| a | b | b | c | a | a | a | b | b | b | c | a | a | a | a | |
| b | c | a | b | b | a | b | c | c | b | b | a | a | b | b | |
| c | b | a | c | b | a | b | b | c | b | b | a | a | b | b | |

RESULT OF 1st LOOP OF 424-432 / RESULT OF 2nd LOOP OF 424-432 / RESULT OF 3rd LOOP OF 424-432

FIG. 5B

| ∧ | | | | 001 | | 010 | | 10 | 10 | 010 | | 01 | | 010 | 010 | 0010 |
|---|--|--|--|-----|--|-----|--|----|----|-----|--|----|--|-----|-----|------|
| | | | | 011 | 010 | | 100 | 101 | 110 | 111 | 0010 | 0011 | 0100 | 0101 | 00100 | 00101 |
| | | | | b | b | | a | a | a | a | c | c | b | b | c | c |
| | | | | c | b | | a | a | b | b | c | b | b | b | c | c |
| | | | | c | b | | a | a | b | b | c | b | b | b | c | c |

RESULT OF 1st LOOP OF 426-432 / RESULT OF 2nd LOOP OF 426-432

FIG. 5C

STEP 434

| ∧ | 0 | 1 | 00 | 01 | 10 | 11 | 001 | 010 | | | 0010 |
|---|---|---|----|----|----|----|-----|-----|--|--|------|
| | 0 | 0 | 1 | 1 | 1 | 1 | 1 | | | | |
| | 0 | 0 | 0 | 1 | 0 | 0 | 0 | 0 | | | 1 |
| | 1 | 0 | 0 | 0 | 0 | 0 | 1 | 1 | | | 1 |
| | 0 | 0 | 1 | 0 | 0 | 0 | 0 | 0 | | | 1 |

STEP 436

METHOD AND APPARATUS FOR COMPILING AND IMPLEMENTING STATE-MACHINE STATES AND OUTPUTS FOR A UNIVERSAL CELLULAR SEQUENTIAL LOGIC ARRAY

RELATED APPLICATIONS

This application is a continuation-in-part of Ser. No. 07/895,607 filed Jun. 8, 1992, entitled "Analysis of Cellular Array Technology", now U.S. Pat. No. 5,377,123, and Ser. No. 07/614,686 filed Nov. 15, 1990, entitled "Method and Apparatus for Compiling and Implementing State-Machine States and Outputs for a Universal Cellular Sequential Logic Array" and to issue as U.S. Pat. No. 5,253,363 on Oct. 12, 1993, which is a continuation of Ser. No. 07/168,376, filed on Mar. 15, 1988, entitled "Universal Cellular Sequential Logic Array", now abandoned. The contents of these applications are incorporated by reference herein.

BACKGROUND

This invention relates to the field of digital logic circuits and sequential state machines.

Digital logic circuitry has proved generally useful for performing logical functions and transformations which may be required in the automated control of complex hardware. However, while a given logic circuit is adept at performing a particular specialized function, few logic circuits are capable of use in anything other than one specialized function. It is therefore generally required that a new logic circuit be designed and fabricated for each new function which is desired, leading to added cost of design and fabrication, and to reduced reliability as new logic circuits may fail due to "bugs" or errors.

In some applications, such as aerospace environments, the need for logic circuit control of complex hardware is acute, and the environment is generally intolerant of reliability errors. The cost of design and fabrication is exacerbated where there are many differing specialized functions to be performed, by the need to design each new logic circuit, by the "learning curve" experienced by process engineers in fabrication of each new logic circuit, and by reliability costs, e.g. testing and replacement, associated within each new logic circuit. Accordingly, there is a need for digital logic circuitry which is tailorable by software to perform any designated logic function.

A logic circuit which was capable of performing more than just one specialized function would obviate many of the problems noted above. Logic circuits which can perform any logic function, and which may be tailored by software to perform a specified function, are called "universal" logic circuits. Universal logic circuits are known by theory to fall into two classes: (1) "combinational" circuits, which may calculate any logic function of its inputs which does not require memory of earlier inputs, and (2) "sequential" circuits, which do have memory of earlier inputs. Construction of universal sequential logic circuits which are susceptible of fabrication with present technology has proved extremely difficult in the past. Accordingly, there is a need for a universal sequential logic circuit which is susceptible of fabrication with present technology.

SUMMARY

A universal sequential logic circuit is constructed from a rectilinear array of elementary logic "cells", with a relatively large number of logic states embodied in a relatively small array. The set of states from a state-machine description of the logic function desired to be performed is compiled into a software association of cellular array states with each state-machine state, and the set of transitions from the state-machine description is compiled into a software association of logical connections between cells. The cellular array performs the state-machine function under software control.

Without limiting the generality of the invention, the rectilinear array generally embodies one bit of cellular array state information for each row of logic cells, stored in diagonal cells of the array called "memory cells". Non-diagonal cells of the array called "function cells" are controlled by stored software, which controls the transfer of cellular array state information from each row to each other.

The memory cells and function cells of the array are of such simplicity in logical component count that an array composed of a significant number of memory cells and function cells may reside in a single microchip, thereby allowing digital signals to pass between elements of the array without passing through input/output buffers. This minimal signal propagation delay allows programmable logic applications of the present embodiment, those applications having a critical minimal propagation delay requirement.

Without limiting the generality of the invention, equivalence classes of state-machine states with respect to sequences of inputs are compiled, and one equivalence class of input sequences (i.e. a bit string representing a sequence of bits input to the array) is assigned to each memory cell. The contents of all memory cells collectively comprise a cellular array state. The function cells select which cellular array state follows the present one by selecting which logic state each memory cell in the array is to store next, each using a multiplexor under the control of stored memory bits.

BRIEF DESCRIPTION OF THE DRAWINGS

FIGS. 5A, 5B and 5C is an example set out in terms of FIG. 4 illustrating compiling a state-machine into a cellular array, wherein FIG. 5A illustrates a state machine, input alphabet, internal states and output states of the state-machine; FIG. 5B illustrates a plurality of sequences for the input characters, the determination of equal effect up to the exhaustion of the untried active input strings; and FIG. 5C illustrates the substitution of binary values and testing for equal effect.

DESCRIPTION

Figure 1A:
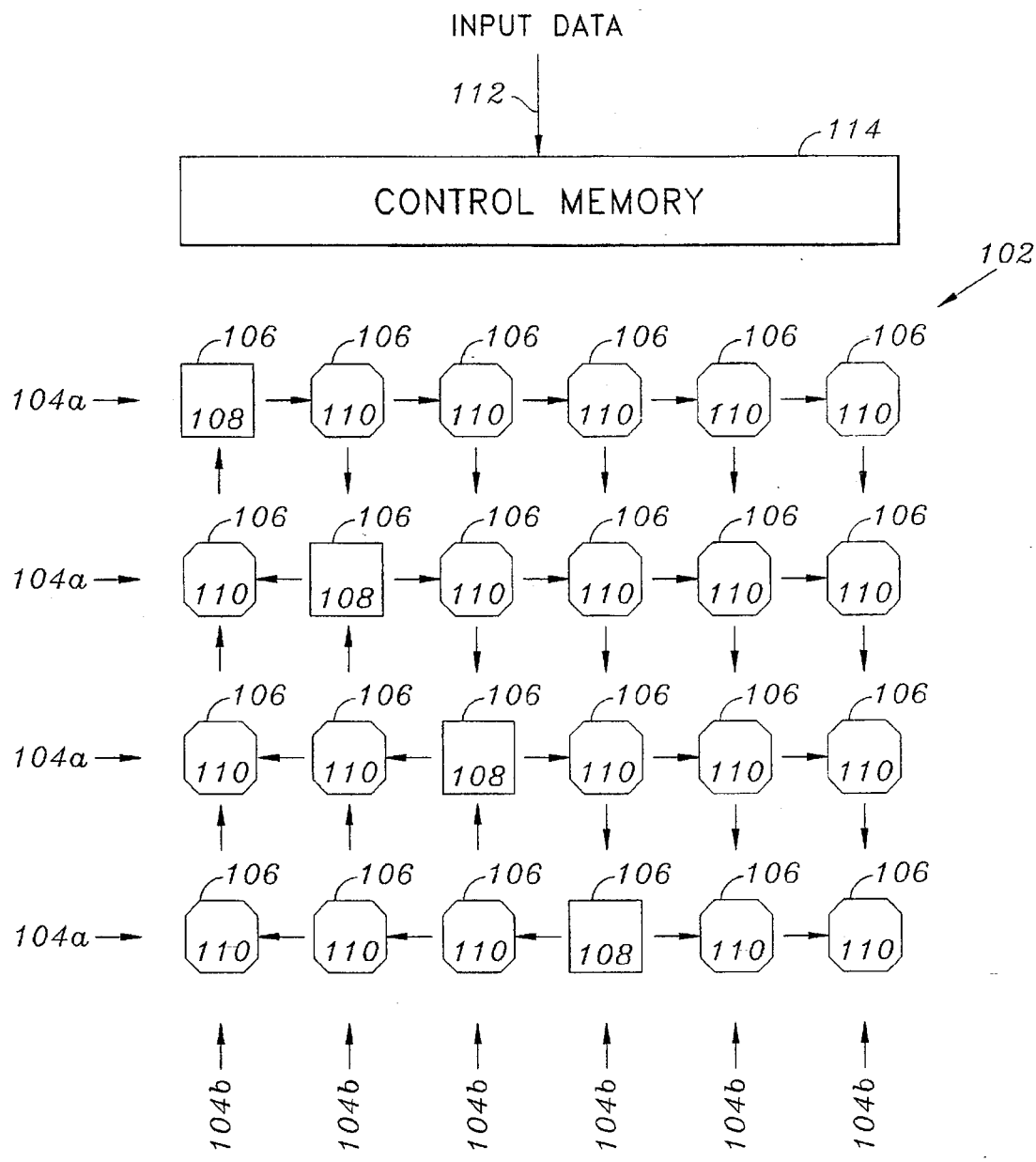
FIG. 1A is as block diagram of a cellular array of the present invention.

FIG. 1A is a block diagram of a cellular array of the present invention. A rectilinear array 102 comprises a set of rows 104a and columns 104b of logic cells 106. Diagonal logic cells 106 are memory cells 108, while non-diagonal logic cells 106 are function cells 110. When the array 102 is square, there is one memory cell 108 per row 104a and per column 104b of logic cells 106, but when the array 102 is rectangular but not square, a set of rows 104a or a set of columns 104b will not have any memory cell 108. The array 102 shown is rectangular with excess columns 104b, so there is one memory cell 108 per row 104a.

Each memory cell 108 may store one bit of state information, so an (m)×(n) array 102 may store a total of (m) bits of state information. Each logic cell 106 is electrically connected to each of its neighbor logic cells 106, for transmitting bits of state information between memory cells 108. When the array 102 receives an input on line 112, each memory cell 108 and each function cell 110 operates under the control of software stored in control memory 114 to alter the state information recorded by the array 102, thus causing the array 102 to operate as a state-machine, as is well-known in the art.

Figure 1B:
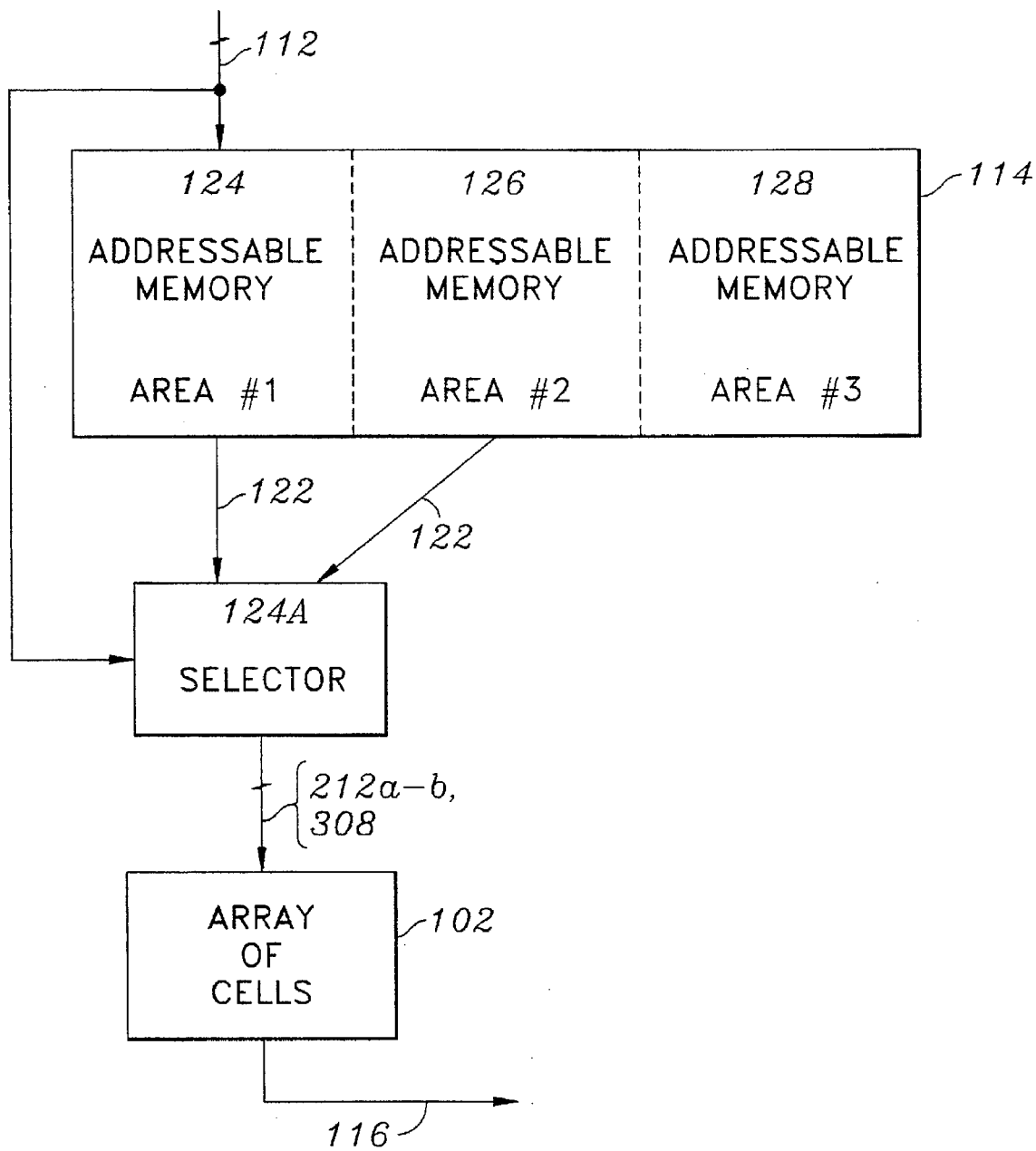
FIG. 1B is a block diagram of circuitry operating in conjunction with a control memory 114.

FIG. 1B is a block diagram of circuitry operating in conjunction with a control memory 114. A control memory 114 records control values to be output on control lines 122 through selector 124A to control logic cells 106. As disclosed below with reference to FIGS. 2–3, each memory cell 108, depending upon embodiment, may receive either one control line 308 or two control lines 212a–b from selector 124A and each function cell 110 receives one control line 308. Selector 124A operates under control of input line 112 and lines 122 to select one set of a plurality of sets of control values output and to transmit the selected set of control values on control lines 212a–b, 308.

A set of output values 116 of the cellular array 102 may be supplied as one or more functions of the states of memory cells 108. In a preferred embodiment, an output value 116 may be generated by routing the contents of one or more memory cells 108 to cellular array columns specifically designated as output columns under control of software recorded in control memory 114.

In a preferred embodiment, control memory 114 may record control values to be output on control lines 122 in two area 124 and 126 of addressable memory. Input lines 112 may be incorporated into an input address for accessing control memory 114, and thus perform the indicated selection operation by addressing one or the other of the areas 124 and 126 of addressable memory.

A portion of control memory 114 may control one or more output values 116. That portion of control memory 114 which controls output functions controls columns containing only function cells 110, rather than from columns containing both function cells 110 and a memory cell 108. The control of an output function is similar to the control of a column containing a memory cell. An integer stored in a register of control memory 114 for a cellular array column containing a memory cell 108 addresses a horizontal logic line, the binary value of the addressed horizontal logic line therefore becoming the next state value for the memory cell 108 in that column. Similarly, an integer stored in a register of control register 114 for specifying an output function addresses a horizontal logic line, the binary value of the horizontal logic line therefore becoming the next state output value 116.

In an alternate embodiment, each output function can be derived as a combinational logic function of the output pins representing the present states of the memory cells 108, as it well known in the art.

Figure 2:
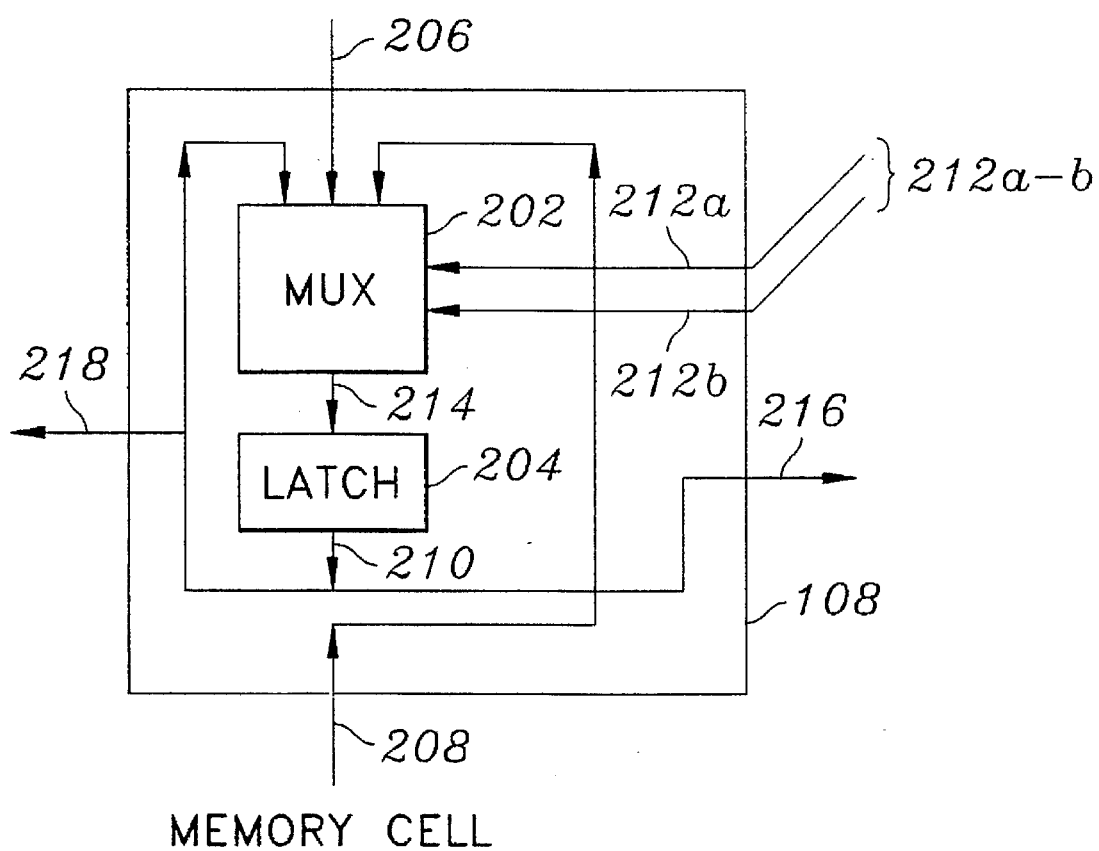
FIG. 2 is a circuit diagram of a memory cell of the present invention.

FIG. 2 is a circuit diagram of a memory cell 108 of the present invention. A memory cell 108 comprises a multiplexor 202, for selecting a next state bit to record, and a latch 204, for recording that state bit. One top input line 206 transmits the state bit from the function cell 110 immediately above the memory cell 108 in the array. If no such function cell 110 exists, no top input line 206 is used. Similarly, one bottom input line 208 transmits the state bit from the function cell 110 immediately below the memory cell 108 in the array. If no such function cell 110 exists, no bottom input line 208 is used. Finally, one repeat input line 210 transmits the state bit from the latch 204 back to the multiplexor 202. The multiplexor 202 selects one of the three input lines 206, 208, 210 under the control of two select bits received on lines 212a–b from control memory 114, and transmits the selected output on line 214. The latch 204 receives the selected output on line 214, records it, and propagates it on right output line 216 and on left output line 218.

An alternative embodiment of a memory cell 108 consists of a latch 204 for recording a state bit of information and a function cell 110 for selecting the present state value of the latch as its next state value. A data bus, which connects all logic cells in the column of this alternative embodiment, yields the single bit which becomes the state bit of the latch at the occurrence of each clock pulse. The latch 204, which receives the value of the data bus connecting all function cells in the column, records the value and propagates it on right output line 216 and on left output line 218. For the case of this alternate embodiment of the memory cell, only a single control line 308 from the cellular array selector means, which determines whether or not the present state value of the latch becomes its next state value, enters the memory cell.

Figure 3:
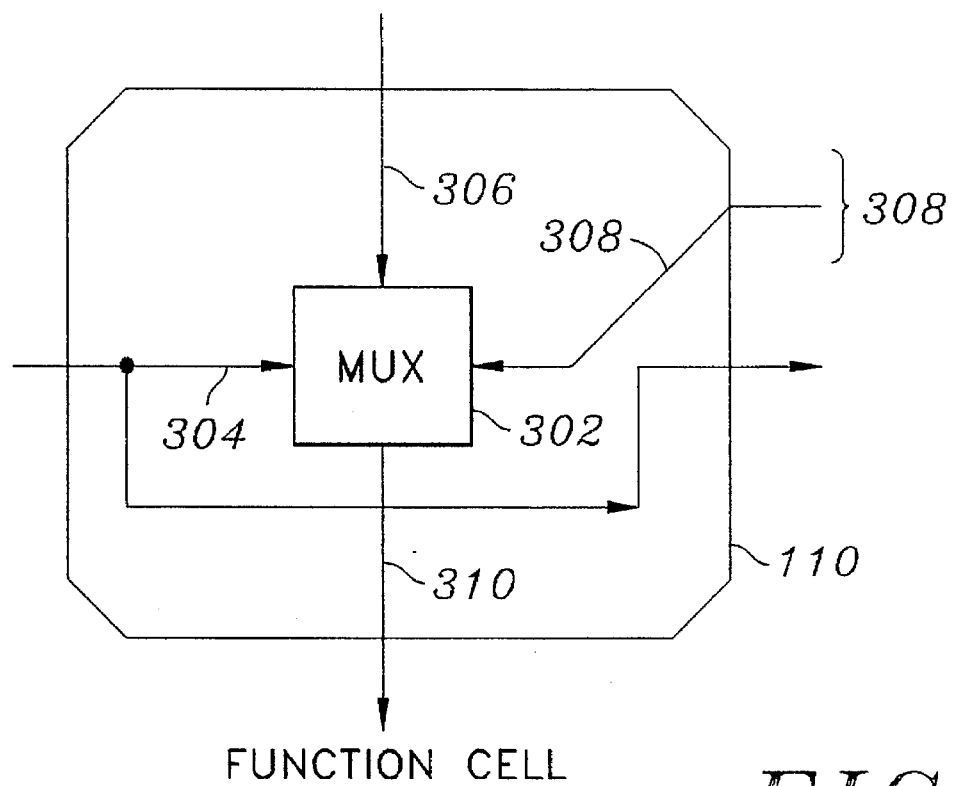
FIG. 3 is a circuit diagram of a function cell of the present invention.

FIG. 3 is a circuit diagram of a function cell 110 of the present invention. A function cell 110 comprises a multiplexor 302, for selecting a next state bit to transmit on its column 104b. One row input line 304 transmits the state bit from the logic cell 106 immediately to the left or right of the function cell 110 in the array. If the function cell 110 is above the diagonal, the row input line 304 will transmit an input from the left of the function cell 110, while if the function cell 110 is below the diagonal, the row input line 304 will transmit an input from the right of the function cell 110. (Thus, the same function cell 110 is simply rotated 180° when placed below the diagonal.) If no such logic cell 106 exists, no row input line 304 is used. Similarly, one column input line 306 transmits the state bit from the function cell 110 immediately above or below the logic cell 106 in the array. If the function cell 110 is above the diagonal, the column input line 306 will transmit an input from above the function cell 110, while if the function cell 110 is below the diagonal, the column input line 306 will transmit an input from below the function cell 110. If no such logic cell 106 exists, no column input line 306 is used. The multiplexor 302 selects one of the two input lines 304, 306 under the control of a select bits received on line 308 from control memory 114 through selector 124A, and transmits the selected output on column output line 310.

An alternative embodiment of the function cell 110 comprises an 'AND' gate for selecting a next state bit to place onto a data bus connecting all logic cells 106 of a cellular array column. One row input line 304 transmits the state bit from the logic cell 106 immediately to the left or right of the function cell 110 in the array. If the function cell 110 is above the diagonal, the row input line 304 will transmit an input from the left of the function cell 110, while if the function cell 110 is below the diagonal, the row input line will transmit an input from the right of the function cell 110. The control line 308 determines whether or not the value of the row input line 304 is to be placed onto the data bus connecting all logic cells of the cellular array column containing said function cell 110.

Figures 4A, 4B:
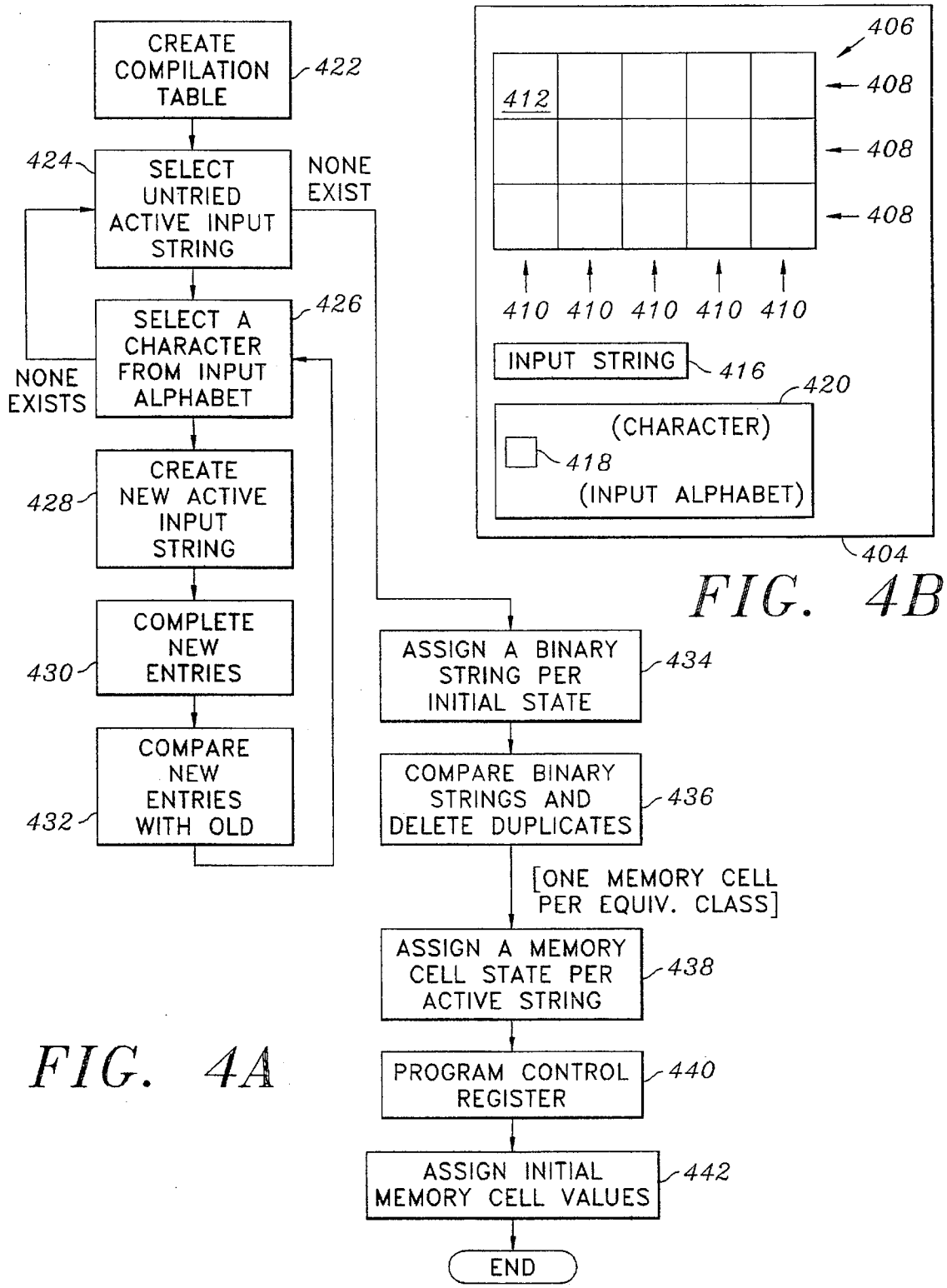
FIG. 4A shows a flowchart of a method of compiling a set of state-machine states into a set of cellular array states.
FIG. 4B shows a set of related registers, including a compilation table.

FIG. 4A shows a flow chart of a method of compiling a set of state-machine states into a set of cellular array states; FIG. 4B shows a set of related registers, including a compilation table. Equivalence classes of input sequences are generated. The space of all possible input sequences is subjected to an exhaustive binary search, with sequences yielding duplicate effect being discarded, until all equivalence classes have been found. One memory cell state is then associated with each such equivalence class. The set of all memory cell states collectively comprise a cellular array state.

The compilation method of FIG. 4 may be performed by a computing element under the control of appropriate software, as is well known in the art. During operation of the compilation and assignment method of FIG. 4, the computing element may make use of several registers in a memory 404, including a compilation table 406 having a set of rows 408 and columns 410 and a row entry 412 at the intersection of each row 408 and column 410.

Therefore, at step 422, the compilation table 406 is created with one row 408 for each state-machine state and one column 410 for each active input string 416. Initially, the null string $\Lambda$ is the only active input string 416 and it is marked as untried. Each row entry 412 for the null string $\Lambda$ is set equal to the state-machine state for its row 408.

At step 424, an untried active input string 416 is selected and called the old active input string 416. If no untried active input string 416 exists, control transfers to step 434 to terminate the compilation method of FIG. 4. Else every character 418 from the state-machine input alphabet 420 is marked untried, and control transfers to step 426.

At step 426, a character 418 from the state-machine input alphabet 420 is selected and marked as tried. Typically the entire state-machine input alphabet will comprise the characters "0" and "1". If no untried character 418 exists, control transfers to step 424 to try another selected active input string 416. Else control transfers to step 428.

At step 428, a new active string 416 is created, equal to the selected old active input string 416 with the selected character 418 from the state-machine input alphabet 420 appended. The new active input string is marked untried.

At step 430, each row entry 412 is set equal to the resulting target state-machine state for the new active input string 416 created in step 428, applied one input symbol 418 at a time, in reverse order, to the same target state-machine states as in the row entries 412 in the column 410 corresponding to the null string $\Lambda$.

At step 432, the column 410 for the new active string 416 is compared with all previous columns 410 in the compilation table 406. If the new column 410 is a duplicate of any previous column 410, it is deleted and its active input string 416 is deleted.

At step 434, no further untried active input strings 416 exist. A binary value is assigned to each state machine state. In one embodiment of the present invention, assignment of binary values could be performed under a predetermined constraint, such as to conform binary values to functions to be output from the cellular array, or to yield a preferred ultimate size of the cellular array. In an alternate embodiment, assignment of binary values could be performed automatically without reference to any such constraint.

In the case that multiple output functions are assigned to the state machine, each unique output function may constitute a unique binary value assignment so that multiple cellular array implementations of the state machine may occur simultaneously.

At step 436, after substitution of the assigned binary values for each memory cell state in each row entry 412, each column 410 is compared with each other column 410 for duplication. Any duplicate columns 410, and their associated active input strings 416, are eliminated.

At step 438, the search for equivalence classes is complete. One cellular array memory cell along the main diagonal of the cellular array is assigned for each remaining active input string 416 (and associated column 410).

If, at step 434, the set of binary values assigned to the state machine states constitute an appropriate output function of the cellular array to be generated in an output column, then the memory cell occupying the output column which is to generate that output function is assigned the $\Lambda$ input sequence. In the case that multiple output functions are assigned to the state machine and each output function is used to specify a unique binary value assignment, each output column of the cellular array is associated with the $\Lambda$ input sequence which is the column header of its unique binary value assignment.

At step 440, a control register 114 is programmed for control of transfer of information from each memory cell 108 to each other memory cell 108. As disclosed with reference to FIG. 1, the control register 114 may comprise a plurality of bits for controlling the selection of binary values which are transferred from each memory cell 108 to each other memory cell 108 upon input of input bit values, and for controlling the selection of binary values which are output by the cellular array 102.

The assignment of cellular array states and programming of the control register 114 may be done so as to satisfy predetermined constraints with respect to output behavior of the array 102. The size of the array and the choice of array states is best made so as to allow easy generation of output values for output to other circuitry in a circuit which includes the array 102 as a component. Thus, where a particular output function has been specified for the array 102 to generate, it is preferable for the particular output function to be controlled by control memory 114 for a column of the array 102, as disclosed above with reference to FIG. 1A. In a preferred embodiment of the invention, additional output functions may be generated by adding further columns 104b controlled by appropriate control memory 114 to generate the predetermined output functions. In an alternate embodiment of the invention, a predetermined output function may be generated by boolean combination of column output values using Boolean circuitry.

Thus, in a preferred embodiment of the invention, step 440 is performed with reference to predetermined constraints for an output value function. The cellular array which results is thus constructed to satisfy such predetermined constraints for output value functions, yet be constructed in a universal and modular manner.

At step 440, a two dimensional control memory array is constructed. The number of entries required in the control memory array is the number of memory cells used in the cellular array times the number of input characters in the input alphabet of the state-machine being emulated. In the case that the control memory array is implemented as a programmable logic array rather than as random access memory, the two-dimensional array of data represented by the control memory array is generated by the programmable logic array, as a function of the state-machine input lines, rather than occupying a two-dimensional location in physical memory. The control memory array—or the output of the control memory programmable logic array—is a two dimensional array indexed on its ordinate by each input character of the input alphabet of the state-machine being emulated and on its abscissa by a label corresponding to a unique memory cell of the cellular array, in accordance with Table 1.

TABLE 1

Control Memory Array input state 0
input state 1
input state (k–1)
memory cell number: 0  1  2  (1–1)  $Z_0$  $Z_1$  $Z_{(n-1)}$ In Table 1, the number of input characters in the input alphabet of the state-machine under consideration is assumed to be k, the number of memory cells along the main diagonal of the cellular array implementation is assumed to be 1, and the number of output functions of the state table under consideration is assumed to be n.

In Table 1, memory cell number 0—the leftmost horizontal index—refers to the memory cell occupying the leftmost column of the cellular array, the top left main diagonal location; memory cell number 1 refers to the memory cell occupying the second to the top main diagonal location, etc.; finally, memory cell number (1-1) refers to the memory cell occupying the bottom right main diagonal location. This numerical labelling of the memory cells in multiple locations along the main diagonal has a physical significance, as the control lines of a selector occupying a column of the cellular array (whether a column maintaining a memory cell occupying a location in the main diagonal or an output column) are set to one of the values 0, 1, . . . , (1-1) to specify which memory cell in the main diagonal is to have its binary value selected to enter the memory cell of the column of that selector at the occurrence of the next clock pulse. The memory cells occupying multiple locations along the main diagonal are the cells which have their binary contents routed to all part of the cellular array at the occurrence of each clock pulse. The 1 bit memory elements occupying the output columns, which directly feed output pin buffers, receive their next binary values from the memory cells occupying multiple locations along the main diagonal.

The memory cells occupying the output column locations are labelled $Z_0, Z_2, \ldots, Z_{n-1}$, in accordance with the output functions which they support.

At step 440, the entries in the control memory array of Table 1 are filled in. Each entry in the control memory array exhibited in Table 1 is indexed on its abscissa by a column number, or a column labelling for the case of a column producing an output function, and on its ordinate by an input character of the input alphabet of the state-machine being emulated. The integer which is to occupy a particular entry in the array of Table 1 specifies which memory cell is to have its contents routed to the memory cell designated by its abscissa index, under the state-machine input character designated by its ordinate index. The memory cell number occupying that control memory entry is the memory cell associated with the input sequence obtained by applying the input character designated by the ordinate index of that control memory location to the input sequence selected at step 438 to assign to the memory cell which is on the abscissa index of that control memory location.

At step 440, the cellular array control memory is configured as the two-dimensional control memory of Table 1. The input lines of the state-machine, each unique binary encoding of said input lines corresponding to a unique input character of the input alphabet of the state-machine, address the control memory. At each address location of control memory, a word of data is to exist, that word of data to consist of that particular row of integers of Table 1 specifically indexed on its ordinate axis by the state-machine input character corresponding to the binary encoded values of the state-machine input lines which address control memory. The integers residing in the addressed word of control memory are to exist in binary representation, each binary encoded integer of the addressed word to be placed on the control lines of a selector in a unique column of the cellular array.

For the case that the control memory of the cellular array is implemented as a programmable logic array, then at step 440, the programmable logic array is to be programmed to produce the multi-output combinational logic function specified by the control memory of Table 1. Each unique binary interpretation of the state-machine input lines, each such interpretation corresponding to a unique input character of the state-machine, therefore specifies the appropriate row of the control memory array which is to be produced by the programmable logic array as a multi-output binary function of said state-machine input lines. This multi-output function is to be produced as a minimal gate-count two-level AND-OR realization, as is well known in the art of programmable logic implementation.

At step 442, the initial cellular array memory values are determined. Typically, an initial state-machine internal state is designated as a starting state of the state-machine to be emulated. This internal starting state is the key to specifying the initial cellular array memory values. This internal starting state indexes a row 408 of compilation table 406. Each memory cell of the cellular array which is used to emulate the state-machine has associated with it a unique input sequence (output of step 438). For the case that the row entry 412, for that row 408 corresponding to the starting state of the state-machine, in that column 410 of the compilation table associated with the input sequence assigned to said memory cell is a 0, then the said memory cell is set to the initial binary value of 0. For the case that the row entry 412 of the compilation table 408 is a 1, then the said memory cell is set to the initial binary value of 1.

The compilation Table 406, FIG. 5B, is initiated at step 422 with the Λ column extracted directly from FIG. 5A. After the execution of step 422, and, therefore, initially at step 424, the leftmost column of FIG. 5B is the only entry in the Compilation Table 406. At step 426, the 0 input character 418 is selected from the input alphabet 420; at step 428, this input character is appended to the old active Λ string to obtain a new active input string Λ0=0 (416); at step 430, the column entries for the new active input string 0, extracted directly from FIG. 5A, are completed; at step 432, the new column is compared with the existing Λ column for equal effect and entered into the Compilation Table 406 since the new column does not have equal effect. This new column is labelled "result of first loop of 426–432."

The execution of the second loop of steps 426–432 results in the third column of the compilation table, labelled accordingly in FIG. 5B. The execution of the second loop of steps 426–432 completes the first loop of steps 424–432, since both input characters 418 of the input alphabet 420 {0,1} have been selected. The second and third columns of the Compilation Table 406 are jointly labelled accordingly.

The second loop of steps 424–432 yields the fourth and fifth columns of the Compilation Table 406—input characters 0 and 1, respectively, are appended to the old active 0 string to obtain new active input strings 416 to apply to the state table, FIG. 5A, in character reverse order. Columns 4 and 5 are labelled accordingly. The procedure continues through loop 424–432 until no untried active input string for selection at step 424 remains. The columns having input strings in the top row of FIG. 5B have equal effect with previous columns and therefore are not entered as active input strings.

At step 434, a binary value is assigned to each internal state, resulting in the leftmost column of FIG. 5C. At step 436, these assigned binary values replace the internal states of all unique columns of FIG. 5B, resulting in the remaining portion of FIG. 5C. Duplicate columns are tagged and deleted as before. At step 438, a unique memory cell (an element of the cellular array main diagonal) is assigned to each unique column of FIG. 5C.

Only 6 unique input sequences of FIG. 5c are assigned to the main diagonal cellular array elements, rather than all 7 unique input sequences. The $\Lambda$ sequence is assigned to the memory element occupying the output column of the cellular array, which directly feeds an output pin buffer, and not to a main diagonal entry. The reason will become clear at step 440.

At step 440, a control memory array is constructed. The number of bytes of date required in the control memory array is the number of memory cells used in the cellular array times the number of input states of the sequential machine being emulated, hence 14 bytes of control memory data are required—7 memory cells total, 6 memory cells occupying multiple locations along the main diagonal and one memory element occupying a location in the output column, times two input states of the sequential machine being emulated. Although there are 7 unique columns of FIG. 5c, only 6 such columns require assignment to memory cells occupying multiple locations along the main diagonal of the cellular array, as will be exhibited. In the case that the control memory is implemented as a programmable logic array rather than as random access memory, 14 unique bytes of data are generated by the programmable logic array, as a function of the sequential machine input lines, rather than the 14 bytes occupying physical memory, as in the above case of random access control memory. The two dimensional array representing the control memory—or the output of the control memory programmable logic array—is exhibited in Table 2. The two dimensional array is indexed on its ordinate by each input state of the sequential machine being emulated and on its abscissa by a label corresponding to a unique memory cell of the cellular array.

TABLE 2

| Control Memory Array | | | | | | | |
|---|---|---|---|---|---|---|---|
| Input state 0 | 2 | 1 | 0 | 1 | 5 | 5 | 0 |
| Input state 1 | 3 | 1 | 4 | 4 | 3 | 5 | 1 |
| Memory cell number: | 0 | 1 | 2 | 3 | 4 | 5 | $Z_0$ |

In Table 2, memory cell number 0—the leftmost horizontal index—refers to the memory cell occupying the leftmost column, the top left diagonal location, whereas memory cell number 5 refers to the memory cell occupying the bottom right diagonal location. This numerical labelling of the memory cells in multiple locations along the main diagonal has a physical significance, as the control lines of a selector occupying a column of the cellular array (whether a column containing a memory cell occupying a location in the main diagonal or an output column) are set to the value 0 through 5 to specify which memory cell in the main diagonal is to have its binary value selected to enter the memory cell of the column of that selector at the occurrence of the next clock pulse. The memory cells occupying multiple locations along the main diagonal are the cells which have their binary contents routed to all parts of the cellular array at the occurrence of each clock pulse. The memory elements occupying the output columns, which directly feed output pin buffers, receive their next binary values from the memory cells occupying multiple locations along the main diagonal.

The memory element occupying the output column location is labelled $Z_0$ in accordance with the output function which it supports.

Each location of the control memory of Table 2 is indexed on its abscissa by a column number, or a column labelling for the case of a column producing an output function, and on its ordinate by an input state of the sequential machine being emulated. The integer occupying a particular location in the array of Table 2 specifies which memory cell is to have its contents routed to the memory cell designated by its abscissa index under the input state designated by its ordinate index. The memory cell designated in that control memory location is the memory cell associated with the input sequence which is obtained by applying the input character designated by the ordinate index of that control memory location to the input sequence selected at step 438 to assign to the memory cell which is the abscissa index of that control memory location.

For instance, in the above case, the integer entry in the upper left corner in the array of Table 2, the entry indexed by memory cell 0, input state 0—that is, the entry which specifies which memory cell along the main diagonal is to be routed to memory cell 0 under input state 0—is that memory cell of the main diagonal associated with the input sequence obtained by applying the input state 0 to the input sequence associated with memory cell 0.

Specifically, the input sequence associated with memory cell number 0, the upper left main diagonal location, is the sequence 0 (second column of FIG. 5c). Applying input state 0 to this input sequence results in the input sequence 00, which is assigned to memory cell number 2 (fourth column of FIG. 5c). Hence, the integer 2 is entered in the upper left location, specifying that the contents of memory cell number 2 is routed to memory cell number 0 under input state 0.

Again, we observe the entry in the control memory array, Table 2, indexed by memory cell 1, input state 0 (second to left entry, top row). The input sequence associated with memory cell number 1 is the input sequence 1 (third column of FIG. 5c). Applying the input state 0 to the input sequence 1 results in the input sequence 10. Noting FIG. 5c, the column of binary entries having input sequence 10 as a column header is identical to the column of binary entries having the input sequence 1 as a column header, and the 10 column is tagged accordingly. Hence, the input sequence which results by applying the 0 input character to the 1 input sequence is the 1 input sequence, and the integer 1 is entered in the second to leftmost column, top row, indicating that memory cell number 1 routes to itself under input state 0.

The reason that the $\Lambda$ input sequence is not assigned to a diagonal memory cell is that the $\Lambda$ sequence does not result by applying an input state to any active input sequence remaining after step 436. That is, the contents of the $\Lambda$ memory cell is not required as a next state value of any other memory cell. Hence, the number of cellular array diagonal elements can be reduced by 1 by omitting the ∧ element. This characteristic of deleting the ∧ sequence from assignment to a main diagonal location is valid for this example but is not true in general.

The ∧ sequence is assigned to the memory element occupying the output column and, therefore, in the control memory array Table 2, the integers occupying the column having the abscissa labelling of $Z_0$ determine which memory cells occupying locations along the cellular array main diagonal are to have their valves routed to the output $Z_0$ column. As in the case of a column of the control memory designating routing to a memory cell occupying a main diagonal location, each entry in the output column of the control memory array specifies which main diagonal memory cell is to have its contents routed to the cellular array output column under the input state which is the ordinate index of that location. For instance, applying the 0 input character to the ∧ sequence results in the 0 input sequence, which is assigned to memory cell 0 (second column of FIG. 5c). Consequently, the integer 0 is entered in the top row (corresponding to input state 0) $Z_0$ column of the central memory array, Table 2.

The remaining entries of the control memory array are completed accordingly.

The boundary value encoding and memory cell routing under input state 0 are the routing designators extracted from the top row of the control memory array, whereas the boundary value encoding and memory cell routing under input state 1 are the routing designators extracted from the bottom row of the control memory array.

At step 440, the control memory of the cellular array is set to produce, for each unique binary representation of the state-machine input line, a unique row of binary encoded integer values of Table 2.

Each such binary encoded integer produced by the control memory occupies a unique column of the cellular array and designates, for a given state-machine input state (corresponding to a binary interpretation of the state-machine input lines), that memory cell number of a memory cell occupying a main diagonal location which is to have its binary contents routed to the memory cell occupying the column of said binary encoded integer.

The control memory may be implemented as a random access memory, addressed by the state-machine input lines. In such a case, each word of the random access memory is loaded with the binary encoded integers which constitute a row of the control memory array of Table 2. Alternatively, the control memory may be implemented as a programmable logic array, in which case the programmable logic array is programmed to produce the binary encoded integers of each row of the control memory array as a multi-output, combinational logic function of the state-machine input lines. This multi-output, combination logic function is to be produced as a two-level minimal gate count, AND/OR realization, as is well known in the art of programmable logic array implementation.

A step 442, the initial cellular array memory values are determined for those memory cells occupying multiple locations along the main diagonal as well as for those memory elements occupying output columns. An internal state of the state-machine being implemented, FIG. 5A, must be selected as an initial state. We assume for purposes of initial memory cell assignment that this initial state is state "a". At step 438, each memory cell of the cellular array is labelled with a unique input sequence. Each such input sequence constitutes a column header of FIG. 5C. The initial value of the memory cell associated with each such input sequence is the binary value of the top row of FIG. 5C (that row associated with starting state "a"), in that column of FIG. 5C having said input sequence as its column header.

While a presently preferred embodiment has been disclosed herein, many variations are possible which remain within the scope of the invention.

I claim:

1. A rectilinear cellular array formed on a single microchip wherein digital signals pass between elements of the array without passing through input/output buffers, the cellular array comprising (i) cells in a plurality of columns and rows wherein multiple cells along a main diagonal of the cellular array are memory cells for storing information and cells removed from the main diagonal are function cells for transferring information between the memory cells, and (ii) at least one output column of cells for providing an output value of the cellular array.

2. An array of claim 1 including means for controlling the array with control memory and selector means.

3. An array as claimed in either claims 1 or 2 wherein the function cell includes only a single multiplexor operable under the action of only one control line and affecting only two input lines of information, and wherein there are two output lines of information from the function cell.

4. An array as claimed in any one of claims 1 to 3 including selector means and a control memory means, only a single control line between the selector means and each function cell, and means for the control memory to control the selector means.

5. An array as claimed in claim 3 wherein only one output line of each function cell is under control of the multiplexor in that function cells.

6. An array as claimed in claim 5 wherein the output line of the function cell under control of the multiplexor constitutes a logical 'OR' function of the input line selected by the multiplexor with a logical 0.

7. An array as claimed in claim 5 wherein the output of the function cell under control of an 'AND' gate constitutes a tri-state bus access to a logical bus which receives function cell outputs in one column of the rectilinear cellular array.

8. An array as claimed in either claim 1 or 2 including a data line connecting cells of a column, the data line being a one bit data bus.

9. An array as claimed in any one of claims 1 or 2, wherein each memory cell includes a function cell and a latch.

10. A function cell for a rectilinear cellular array, the cellular array comprising (i) cells in a plurality of columns and rows wherein each cell along a main diagonal of the cellular array is a memory cell for storing information and each cell removed from the main diagonal is a function cell for transferring information between the memory cells, (ii) at least one output column of cells for providing an output value of the cellular array, and (iii) a control memory and selector means, and wherein the function cell comprises only a single multiplexor operable under the action of only one control line and affecting two input lines of information and wherein there are two output lines of information from the cell.

11. A function cell as claimed in claim 10 wherein the cellular array is formed on a single microchip wherein digital signals pass between elements of the array without passing through input/output buffers.

12. A function cell as claimed in either claims 10 or 11 including only a single control line for operating the multiplexor.

13. A function cell as claimed in either claims 10 or 11 wherein only one output line of the function cell is under control of the multiplexor.

14. A function cell as claimed in any one of claims 10 or 11 wherein the output line of the function cell under control of the multiplexor constitutes a logical 'OR' function of the input line selected by the multiplexor with a logical 0.

15. A function cell as claimed in any one of claims 10 or 11 wherein the output of the function cell under control of the multiplexor constitutes a tri-state bus access to a logical bus which receives function cell outputs in one column of the rectilinear cellular array.

16. A function cell as claimed in any one of claims 10 or 11 wherein there are multiple function cells located in an output column of the cellular array, the function cells acting to transfer information from the memory cells to output buffers for supplying an output function of the cellular array.

17. Multiple cellular arrays, as claimed in any one of claims 10 or 11 on multiple micro-chips operating in conjunction with each other.

* * * * *

UNITED STATES PATENT AND TRADEMARK OFFICE
CERTIFICATE OF CORRECTION

PATENT NO. : 5,644,497

DATED : July 1, 1997

INVENTOR(S) : Edward Hyman

It is certified that error appears in the above-identified patent and that said Letters Patent is hereby corrected as shown below:

On title page, at [56], please replace "11/1971" with --11/1968--.

Column 2, line 39, "as" should read --a--.

Column 3, line 4, "cell" should read --cells--.

Column 3, line 40, "area" should read --areas--.

Column 4, line 53, delete "a" after "of".

Column 5, line 9, "effect" should read --effects--.

Column 6, line 2, insert -- - -- after "state".

Column 6, line 50, "boolean" should read --Boolean--.

Column 7, lines 10-16, In the parent application, boxes exist in TABLE 1.

Column 7, line 41, "part" should read --parts--.

Column 8, line 26, "AND-" should read --AND/--.

UNITED STATES PATENT AND TRADEMARK OFFICE
CERTIFICATE OF CORRECTION

PATENT NO. : 5,644,497

DATED : July 1, 1997

INVENTOR(S) : Edward Hyman

It is certified that error appears in the above-identified patent and that said Letters Patent is hereby corrected as shown below:

Column 8, line 34, "compilation table" should read --Compilation Table--.

Column 8, lines 39, 40, "compilation table" should read --Compilation Table--.

Column 8, line 43, "compilation table" should read -- Compilation Table--.

Column 8, line 45, "compilation" should read --Compilation--.

Column 8, line 60, "compilation table" should read -- Compilation Table--.

Column 9, line 18, "5c" should read --5C--.

Column 9, line 27, "date" should read --data--.

Column 9, line 36, "5c" should read --5C--.

Column 10, line 42, "5c" should read --5C--.

Column 10, line 45, "5c" should read --5C--.

Column 10, line 52, "5c" should read --5C--.

Column 10, line 53, "5c" should read --5C--.

UNITED STATES PATENT AND TRADEMARK OFFICE
CERTIFICATE OF CORRECTION

PATENT NO. : 5,644,497

DATED : July 1, 1997

INVENTOR(S) : Edward Hyman

It is certified that error appears in the above-identified patent and that said Letters Patent is hereby corrected as shown below:

Column 10, line 66, "is" should read --are--.

Column 11, line 10, "valves" should read --value--.

Column 11, line 20, "5c" should read --5C--.

Column 11, line 58, "A" should read --At--.

Signed and Sealed this

Fourteenth Day of July, 1998

*Attest:*

*Attesting Officer*

BRUCE LEHMAN

*Commissioner of Patents and Trademarks*